United States Patent
Hudgens et al.

(10) Patent No.: US 6,507,061 B1
(45) Date of Patent: Jan. 14, 2003

(54) MULTIPLE LAYER PHASE-CHANGE MEMORY

(75) Inventors: Stephen J. Hudgens, Santa Clara, CA (US); Tyler A. Lowrey, San Jose, CA (US); Patrick J. Klersy, Lake Orion, MI (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/945,331

(22) Filed: Aug. 31, 2001

(51) Int. Cl.[7] .......................... H01L 29/76; H01L 29/94; H01L 31/062; H01L 31/118; H01L 31/119
(52) U.S. Cl. ..................... 257/295; 257/296; 257/310; 257/52
(58) Field of Search ................................. 257/296, 295, 257/309, 310, 19, 28, 52

(56) References Cited

U.S. PATENT DOCUMENTS

| | | | | |
|---|---|---|---|---|
| 4,115,872 A | * | 9/1978 | Bluhm | 365/163 |
| 4,203,123 A | * | 5/1980 | Shanks | 357/2 |
| 5,363,329 A | * | 11/1994 | Troyan | 365/184 |
| 5,837,564 A | * | 11/1998 | Sandhu et al. | 438/95 |
| 5,920,788 A | * | 7/1999 | Reinberg | 438/466 |
| 6,114,713 A | * | 9/2000 | Zahorik | 257/4 |
| 6,284,643 B1 | * | 9/2001 | Reinberg | 438/622 |
| 2001/0034078 A1 | * | 10/2001 | Zahorik et al. | 438/95 |

* cited by examiner

*Primary Examiner*—George Eckert
*Assistant Examiner*—Jesse A. Fenty
(74) *Attorney, Agent, or Firm*—Trop, Pruner & Hu, P.C.

(57) ABSTRACT

A phase-change memory may be formed with at least two phase-change material layers separated by a barrier layer. The use of more than one phase-change layer enables a reduction in the programming volume while still providing adequate thermal insulation.

27 Claims, 3 Drawing Sheets

MULTIPLE LAYER PHASE-CHANGE MEMORY

BACKGROUND

This invention relates generally to memories that use phase-change materials.

Phase-change materials may exhibit at least two different states. The states may be called the amorphous and crystalline states. Transitions between these states may be selectively initiated, for example, through temperature changes. The states may be distinguished because the amorphous state generally exhibits higher resistivity than the crystalline state. The amorphous state involves a more disordered atomic structure and the crystalline state involves a more ordered atomic structure. Generally, any phase-change material may be utilized; however, in some embodiments, thin-film chalcogenide alloy materials may be particularly suitable.

The phase-change may be induced reversibly. Therefore, the memory may change from the amorphous to the crystalline state and may revert back to the amorphous state thereafter, or vice versa. In effect, each memory cell may be thought of as a programmable resistor that reversibly changes between higher and lower resistance states in response to temperature changes. The temperature changes may be induced by resistive heating.

In some situations, the cell may have a large number of states. That is, because each state may be distinguished by its resistance, a number of resistance-determined states may be possible, allowing the storage of multiple bits of data in a single cell.

A variety of phase-change alloys are known. Generally, chalcogenide alloys contain one or more elements from column VI of the periodic table. One particularly suitable group of alloys is GeSbTe alloys.

A phase-change material may be formed within a passage or pore defined through a dielectric material. The phase-change material may be coupled to electrodes on either end of the passage. The contacts may pass current through the passage in order to program the cell through resistive heating or to read the programmed state of the cell.

Current phase-change memories rely on the poor thermal conductivity of the chalcogenide phase-change memory material itself to thermally insulate the programmable volume from heat loss to the upper electrode. Consequently, in order to achieve better thermal isolation and, therefore, more energy efficient programming of the programmable volume, the thickness of the chalcogenide layer has to be increased. An increase of the thickness of the layer, however, also increases the volume of material that is capable of undergoing a phase-change during programming. Increasing the volume of material that undergoes the phase-change can adversely affect reliability, stability, and cycle life of the memory.

Thus, there is a need for a phase-change memory with improved characteristics and performance.

DETAILED DESCRIPTION

Figure 1:
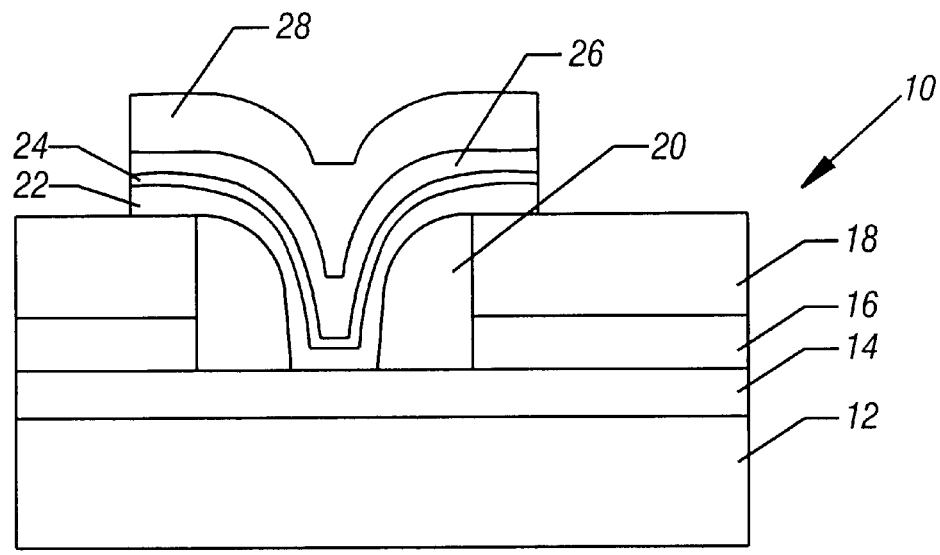
FIG. 1 is an enlarged, cross-sectional view of one embodiment of the present invention.

Referring to FIG. 1, a phase-change memory 10 may be formed on an integrated circuit substrate 12. The phase-change memory 10 may include a lower electrode 14 that in one embodiment may be made of cobalt silicide. An upper electrode 28 sandwiches a lower, programmable phase-change layer 22 and an upper phase-change layer 26. Between the phase-change layers 22 and 26 is a chemical barrier layer 24.

The pore of the phase-change memory 10 may be defined by sidewall spacer 20. That is, the region of contact between the lower electrode 14 and the phase-change layer 22 may be of a size determined through the imposition of the cylindrical sidewall spacer 20. In one embodiment, the pore, including the phase-change layers 22 and 26, may be defined within an opening formed in a pair of insulator layers, such as the upper insulating layer 18 and the lower insulating layer 16. The upper insulating layer 18 may be silicon dioxide in one embodiment, and the lower insulating layer 16 may be silicon nitride in one embodiment.

While a structure is illustrated in which two layers of phase-change material are utilized, more layers may be utilized in other embodiments. The thickness of the first phase-change layer 22 may be in the range of 300 to 500 Angstroms. The thickness of this layer may be chosen so as to reduce the vertical dimension of the programmed volume. The phase-change layer 22 may be deposited in a cup-shaped opening formed by the sidewall spacer 20, resulting in a cup-shaped phase-change layer 22. A similar shape is therefore defined for the barrier layer 24 and the overlying phase-change layer 26. In one embodiment, the phase-change layers 22 and 26 may be formed using vapor deposition.

The barrier layer 24 provides a chemical barrier between the underlying programmable phase-change layer 22 and the overlying phase-change layer 26. The overlying phase-change layer 26 may be provided primarily for thermal isolation in some embodiments. The barrier layer 24 may have adequate electrical conductivity so that the programming current passing through the programmable phase-change layer 22 can flow laterally around any resistive region of the thermal isolation phase-change layer 26 and may contact to the conductive regions of this layer distant from the programming region.

Typical thickness of the barrier layer 24 may be in the range of 50 to 200 Angstroms. The thermally insulating phase-change material layer 26 may also be vapor deposited in situ onto the barrier layer 24. The thermally insulating phase-change material layer 26 can be made of the same composition as the programmable phase-change layer 22 or it can be chosen from a range of available chalcogenide materials with poor thermal conductivity. In one embodiment, it is advantageous that the layer 26 has a thermal conductivity of less than 1E-2 W/cm.K and good electrical conductivity, for example, greater than 40 $\Omega^{-1}$ cm$^{-1}$. The thickness of the layer 26 can be in the range of from 100 to more than 1,000 Angstroms.

Figure 2:
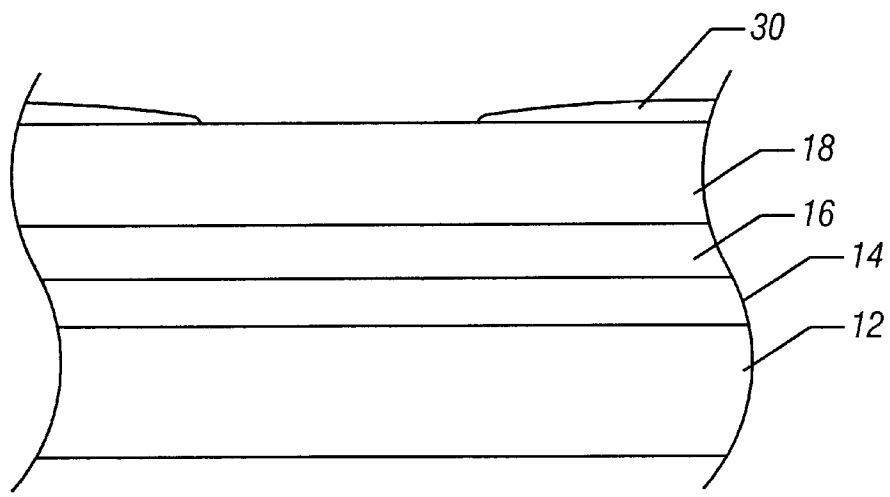
FIG. 2 is an enlarged, cross-sectional view of an initial stage of manufacturing of the device shown in FIG. 1 in accordance with one embodiment of the present invention.

Referring to FIG. 2, a mask 30 may be defined on a stack including the substrate 12 covered by the lower electrode 14, the first insulating layer 16, the second insulating layer 18.

Figure 3:
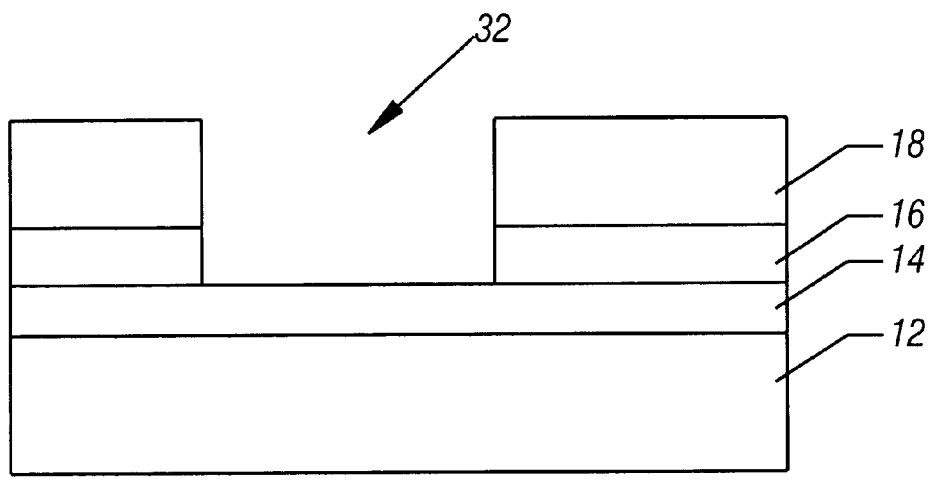
FIG. 3 is an enlarged, cross-sectional view of the embodiment shown in FIG. 2 at a later stage of manufacturing in accordance with one embodiment of the present invention.
Figure 4:
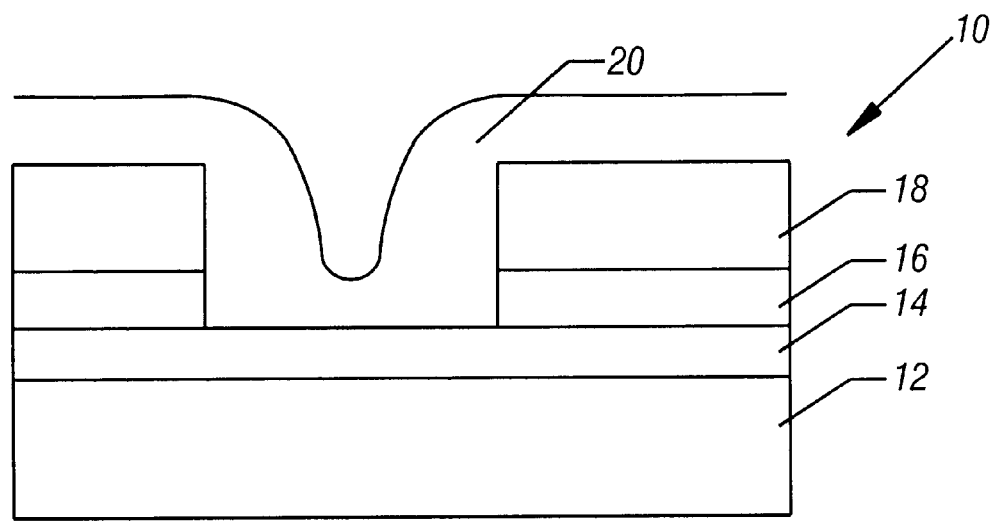
FIG. 4 is an enlarged, cross-sectional view of the embodiment shown in FIG. 3 at still a later stage of manufacturing in accordance with one embodiment of the present invention.
Figure 5:
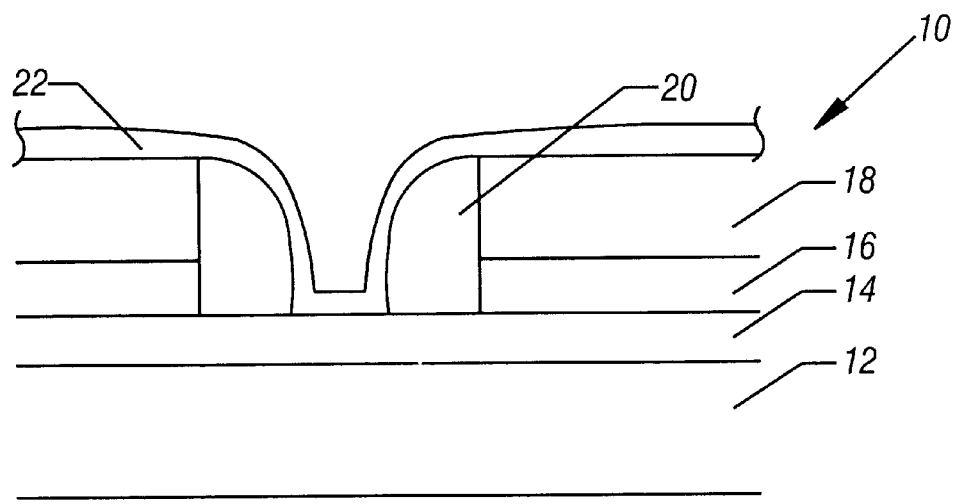
FIG. 5 is an enlarged, cross-sectional view corresponding to FIG. 4 at still a later stage of manufacturing in accordance with one embodiment of the present invention.

Turning next to FIG. 3, an opening 32 may be etched through the insulating layers 16 and 18, stopping on the lower electrode 14. In one embodiment, an etchant that is selective to the layers 16 and 18 and that is less effective against the electrode 14 may be utilized. Thereafter, the insulating material 20 may be deposited into the pore and over the layer 18, as shown in FIG. 4. A variety of insulating layers may be utilized including oxide. In one embodiment, a tetraethylorthosilicate (TEOS) oxide deposition process may be utilized. The deposited layer 20 is then subjected to an anisotropic etch to form the cylindrical sidewall spacer 20 as shown in FIG. 5.

Figure 6:
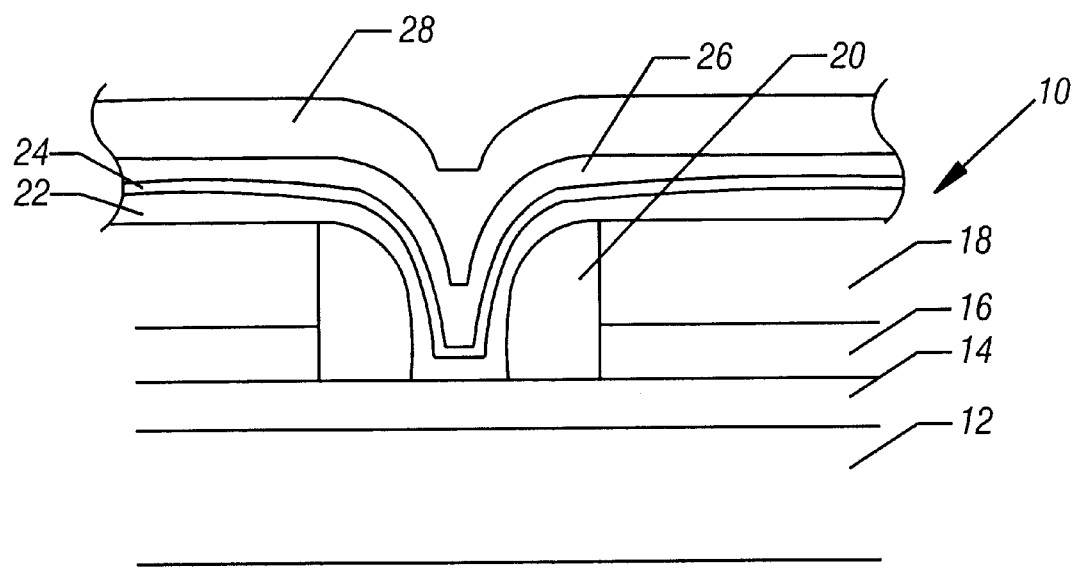
FIG. 6 is an enlarged, cross-sectional view of the embodiment shown in FIG. 5 at a later stage of manufacturing in accordance with one embodiment of the present invention.

The sidewall spacer 20 and insulating layer 18 may then be coated with the programmable phase-change layer 22. The layer 22 may then be coated with the barrier layer 24 and the insulating phase-change layer 26. Finally, the upper electrode 28 may be deposited. Because of the imposition of the sidewall spacer 20, each of the layers 22, 24, 26 and 28, to some degree, may be defined in a cup-shaped configuration. The structure shown in FIG. 6 may then be subjected to patterning and etching to result in the structure shown in FIG. 1 in some embodiments.

Through the use of multiple chalcogenide layers, the memory cell 10 benefits from the enhanced thermal isolation. At the same time, the volume of material that undergoes a phase-change during programming may be relatively limited. In other words, the insulating effect of the combined layers 22 and 26 may reduce heat loss from the memory 10, improving programming performance. At the same time, it is not necessary to program the insulating layer 26, reducing the volume of material that must undergo the phase-change during programming. This may improve reliability, stability, and cycle life of the memory 10 in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory cell comprising:
   a first layer of a phase-change material;
   a second layer of a phase-change material; and
   a non-phase-change material between said first and second layers, said non-phase-change material completely separating said first layer from said second layer.

2. The cell of claim 1 wherein said first layer of a phase-change material is made of a chalcogenide material.

3. The cell of claim 1 wherein said first and second layers are different phase-change materials.

4. The cell of claim 1 wherein said first and second layers of phase-change material are the same material.

5. The cell of claim 1 wherein said non-phase-change material is a conductor.

6. The cell of claim 1 including a semiconductor substrate and an electrical contact formed in said substrate.

7. The cell of claim 6 including an insulating layer formed over said substrate, and a passage formed through said insulating layer.

8. The cell of claim 7 wherein said first and second layers are formed at least in part in said passage.

9. The cell of claim 8 including a sidewall spacer formed in said passage over said contact.

10. The cell of claim 1 wherein said first and second layers are cup-shaped.

11. The cell of claim 1 wherein said second layer of phase-change material is configured to provide thermal isolation.

12. A memory cell comprising:
    a first layer of a phase-change material; and
    a second layer of a phase-change material, only one of said first and second layers of phase-change material being programmable.

13. The cell of claim 12 including a non-phase-change material between said first and second layers.

14. The cell of claim 13 wherein said non-phase-change material is a conductor.

15. The cell of claim 12 wherein the first layer of phase-change material is programmable and the second layer of phase-change material acts as an insulator for said first layer of phase-change material.

16. The cell of claim 12 wherein said first layer of phase-change material is made of a chalcogenide material.

17. The cell of claim 12 wherein said first and second layers are different phase-change materials.

18. The cell of claim 12 wherein said first and second layers of phase-change material are the same material.

19. The cell of claim 12 including a semiconductor substrate and an electrical contact formed in said substrate.

20. The cell of claim 19 including an insulating layer formed over said substrate, and a passage formed through said insulating layer.

21. The cell of claim 20 wherein said first and second layers are formed at least in part in said passage.

22. A memory cell comprising:
    a first layer of a phase-change material;
    a second layer of a phase-change material different from the phase-change material of said first layer; and
    a non-phase-change material between said first and second layers.

23. The cell of claim 22 wherein said non-phase-change material is an electrical conductor.

24. The cell of claim 22 wherein said second layer of phase-change material is configured to provide thermal isolation.

25. A memory cell comprising:
    a first layer of a phase-change material;
    a second layer of a phase-change material; and
    a conductive non-phase-change material between said first and second layers.

26. The cell of claim 25 wherein said first and second layers are different phase-change materials.

27. The cell of claim 25 wherein said first and second layers are of the same material.

* * * * *